United States Patent
Huyart et al.

(10) Patent No.: US 7,890,081 B2
(45) Date of Patent: Feb. 15, 2011

(54) DIRECT FREQUENCY CONVERSION DEMODULATOR AND MODULATOR-DEMODULATOR

(76) Inventors: Bernard Huyart, 10 Hameau de l'Aubépine, Lognes (FR) 77185; Fernando Rangel De Sousa, 5, avenue de la Marne, Esc. 3, 3éme Etage, Apt. 32, Montrouge (FR) 92120

( * ) Notice: Subject to any disclaimer, the term of this patent is extended or adjusted under 35 U.S.C. 154(b) by 847 days.

(21) Appl. No.: 11/576,844

(22) PCT Filed: Oct. 7, 2005

(86) PCT No.: PCT/FR2005/002476

§ 371 (c)(1),
(2), (4) Date: Apr. 6, 2007

(87) PCT Pub. No.: WO2006/040453

PCT Pub. Date: Apr. 20, 2006

(65) Prior Publication Data

US 2008/0064433 A1     Mar. 13, 2008

(30) Foreign Application Priority Data

Oct. 8, 2004    (FR) .................................. 04 10644

(51) Int. Cl.
*H04B 1/16* (2006.01)
(52) U.S. Cl. ..................... 455/337; 455/21; 455/293; 455/276.1; 331/46; 375/322
(58) Field of Classification Search .............. 455/337, 455/21, 293, 276.1, 304, 309, 312; 331/46; 375/322
See application file for complete search history.

(56) References Cited

U.S. PATENT DOCUMENTS 4,264,867 A * 4/1981 Ishii ........................... 329/342

(Continued)

FOREIGN PATENT DOCUMENTS

EP     0805561 A2    11/1997

(Continued)

OTHER PUBLICATIONS

Ellinger, F. et al., "An Antenna Diversity MMIC Vector Modulator for HIPERLAN with Low Power Consumption and Calibration Capability," IEEE Transactions on Microwave Theory and Technique, vol. 49, No. 5, May 2001, pp. 964-969.

(Continued)

*Primary Examiner*—Minh D Dao

(57) ABSTRACT

The demodulator by direct frequency conversion comprises a vector addition device having: a first circuit (1) that furnishes, starting from a first AC signal (LO), a respective AC signal to n outputs that are not all of the same amplitude and of the same frequency, but are out of phase with regard to one another in such a manner that each one is not either in phase nor in opposite phase with any other; a second circuit (2) that splits a second AC signal (RFin) toward n outputs; a number n of summers (3a, 3b, 3c) each receiving, at the input, a respective output of the first circuit (1) and a respective output of the second circuit (2), and; a respective power sensor (4a, 4b, 4c) for each summer, whereby the number n is greater than or equal to 3. The demodulator also comprises digital processing means (5, 6) that furnish the result of the demodulation.

20 Claims, 3 Drawing Sheets

U.S. PATENT DOCUMENTS

| | | | | |
|---|---|---|---|---|
| 4,337,477 | A * | 6/1982 | Sagishima et al. | 348/509 |
| 4,567,442 | A * | 1/1986 | Haussmann | 329/336 |
| 4,608,566 | A * | 8/1986 | Ennis et al. | 342/28 |
| 5,095,536 | A | 3/1992 | Loper | |
| 5,241,566 | A * | 8/1993 | Jackson | 375/277 |
| 5,461,340 | A * | 10/1995 | Chahabadi et al. | 329/349 |
| 5,498,969 | A | 3/1996 | Huyart et al. | |
| 5,684,591 | A * | 11/1997 | Lo et al. | 356/464 |
| 5,841,558 | A * | 11/1998 | Tamura et al. | 398/79 |
| 5,949,545 | A * | 9/1999 | Lo et al. | 356/464 |
| 6,233,434 | B1 * | 5/2001 | Takei | 455/103 |
| 6,442,380 | B1 * | 8/2002 | Mohindra | 455/234.1 |
| 6,486,732 | B2 * | 11/2002 | Fenk et al. | 329/304 |
| 6,650,178 | B1 | 11/2003 | Brankovic et al. | |
| 6,721,548 | B1 * | 4/2004 | Mohindra et al. | 455/234.1 |
| 6,728,298 | B1 * | 4/2004 | Okubo et al. | 375/146 |
| 6,781,534 | B2 * | 8/2004 | Karlquist | 341/143 |
| 6,937,871 | B2 * | 8/2005 | Dick | 455/501 |
| 6,999,528 | B2 * | 2/2006 | Brankovic et al. | 375/329 |
| 7,133,471 | B2 * | 11/2006 | Feher | 375/340 |
| 7,376,180 | B2 * | 5/2008 | Feher | 375/232 |
| 2002/0140514 | A1 * | 10/2002 | Fenk et al. | 331/46 |
| 2004/0101067 | A1 * | 5/2004 | Abe et al. | 375/322 |
| 2004/0161030 | A1 * | 8/2004 | Mohindra et al. | 375/235 |
| 2005/0169408 | A1 * | 8/2005 | Kim | 375/343 |

FOREIGN PATENT DOCUMENTS

| | | | |
|---|---|---|---|
| EP | 0841756 | A2 | 5/1998 |

OTHER PUBLICATIONS

Grajal, J. et al., "A 1.4-2.7-Ghz Analog MMIC Vector Modulator for a Crossbar Beamforming Network," IEEE Transaction on Microwave Theory and Technique, vol. 45, No. 10, Oct. 1997, pp. 1705-1714.

de Sousa, F.R., A to D Converters and Look-up Table Dimensioning for Five-Port Reflectometer Based Systems, Proceedings of the IEEE Instrumentation and Measurement Technology Conference, May 20-22, 2003, pp. 743-747.

International Search Report and Written Opinion for PCT/FR/2005/002476, mailed Apr. 18, 2006.

International Preliminary Report of Patentability for PCT/FR/2005/002476, issued Jun. 19, 2007 (English translation not available).

Communication issued by European Patent Office for EP 05 809 116.6, dated Apr. 15, 2009 with English translation.

Rangel De Sousa, F. et al. A novel rf front-end architecture for multi-band transceivers. Microwave Symposium Digest, 2004 IEEE MTT-S International Fort Worth, TX, USA; Jun. 6-11, 2004, Piscataway, NJ, USA, IEEE, vol. 2, Jun. 6, 2004, pp. 1281-1824, XP010728375; ISBN:0-7803-8331-1.

Rangel De Sousa, F. et al. A new method for automatic calibration of 5-port reflectometers. Microwave and Optoelectronics Conference, 2003. IMOC 2003. Proceedings of the 2003 SBMO/IEEE MTT-S International Sep. 20-23, 2003, Piscataway, NJ, USA, IEEE, US, pp. 1063-1068, XP010667609, ISBN:0-7803-7824-5.

Rangel De Sousa, F. et al. A new method for automatic calibration of 5-port reflectometers. Journal of Microwave and Optoelectronics, vol. 3. N. 5, pp. 135-144, Jul. 2004.

* cited by examiner

Signal detected (V)

Input power (dBm)     Input power (dBm)

Tension (V) = Voltage (V), Temps (ms) = Time (ms)

DIRECT FREQUENCY CONVERSION DEMODULATOR AND MODULATOR-DEMODULATOR

The present invention concerns the field of radio frequency applications, notably the field of carrier frequency radio communications and direct frequency conversion transceivers. The invention relates more particularly to a demodulator and modulator-demodulator suitable notably for use in such transceivers.

Direct frequency conversion receivers—also known as homodyne receivers—are currently coming into widespread use in view of the simplicity of their circuits making it possible to limit costs when compared with heterodyne architectures. This principle is based on vector decomposition of the received modulated signal. Because the modulated signals received are fully characterized by their complex envelope, one base defined by two orthogonal vectors, a so-called Cartesian base, is sufficient to represent them. Nevertheless, it is very difficult to provide a two channel circuit that guarantees orthogonality between two signals over a significant frequency interval such as that used in wideband and/or multi-band systems.

Direct frequency conversion receivers that are the best suited to wideband and/or multi-band systems are 5 or 6 or even more port receivers which supply, from two inputs, at least three output signals from which the Cartesian components of the received modulated complex envelope signal can be estimated. Such systems make it possible to obviate the orthogonality constraints of Cartesian receivers by the use of a calibration procedure over the whole operational frequency band.

Similarly, for the up-link, direct frequency conversion transmitters that employ dual channel modulators carrying Cartesian base signals exist. Modulators based on three vectors have also been proposed.

Such direct frequency conversion receivers or transmitters providing three or more output signals are discussed in the following documents:

EP-A-0, 805,561 discloses a demodulator based on a six port junction, power detectors and an analog processing circuit for extracting the I and Q Cartesian components of the complex envelope of the received signal.

U.S. Pat. No. 6,650,178 discloses a direct conversion receiver with at least three ports. This circuit employs two passive interferometric circuits connected by a phase shifting element. Information carried in the received signal is recovered from power measurements performed at the output ports of the interferometric junctions.

U.S. Pat. No. 5,498,969 discloses a 6-port junction architecture applied to a vector measurement device employing a power splitting circuit, a phase shifting circuit and a matched power detector and three other detectors which are unmatched.

EP-A-0, 841,756 discloses a 6-port receiver employing a correlation at circuit in which the received modulated signal is summed with four signals originating from a reference oscillator but mutually phase shifted each by 90°. The Cartesian component values of the baseband signal are found by an analog circuit from RF signal powers.

U.S. Pat. No. 5,095,536 discloses a direct conversion receiver based on a three-phase architecture and three mixer circuits. The reference signal is split into three phase-shifted components which are then mixed with the received modulated signal. The information is recovered by digital processing of signals supplied at the outputs from filters and amplifiers that follow the mixers.

F. Ellinger, U. Lot and W. Bächtold disclose a modulator circuit employing a vector base with three linearly dependent vectors in a document entitled "*An antenna Diversity MMIC Vector Modulator for HIPERLAN with Low Power Consumption and Calibration Capability*" published on pages 964-969 of the IEEE Transactions on Microwave Theory and Technique, Vol. 49, No. 5, 2001.

"*A 1.4-2.7 GHz Analog MMIC Vector Modulator for a Crossbar Beamforming Network*" by J. Grajal, M. Mahfoudi, J. Gismero and F. A. Petz, published on pages 1705-1714 of the IEEE Transactions on Microwave Theory and Technique, Vol. 45, No. 10, 1997, describes a vector modulator employing three 120° phase-shifted vectors.

The aim of the present invention is to provide a novel demodulation or modulation and demodulation technology, using direct frequency conversion which is simple and economic to implement and which notably can be implemented at high frequencies, typically microwave frequencies while allowing more ready integration than existing technologies, and which is capable of operating over a wide frequency band if this is desirable.

To achieve this aim, the present invention provides firstly a device for vector addition of two modulated or an modulated alternating electric signals comprising:

a first input for receiving a first alternating electric signal;

a second input for receiving a second alternating electric signal;

a first circuit connected to the first input and comprising n outputs, said first circuit supplying, from the first alternating signal applied to the first input, a respective alternating signal on each one of the n outputs, said alternating signals supplied on the n outputs being all of the same amplitude and same frequency but mutually phase-shifted so that each is neither in-phase nor in phase opposition with any other;

a second circuit connected to the second input and comprising a same number n of outputs, the second circuit splitting the second alternating signal into its n outputs; and a same number n of summing circuits each receiving at an input thereof a respective output from the first circuit and a respective output from the second circuit;

in which the number n is greater than or equal to 3.

In preferred embodiments, the invention comprises one or more of the following characteristics:

each one of the alternating signals supplied by the first circuit on its n outputs is phase shifted with respect to each one of the two other alternating signals supplied by the first circuit on its n outputs by 20° to 160° advance or delay.

the summing circuits each comprise two transistors in a differential amplifier configuration.

the first circuit comprises a same number n of amplifiers, the input of each one of the said amplifiers being connected to the first input and the output on each one of the amplifiers then being connected to a respective phase shifting circuit.

the number n is equal to 3.

each one of the alternating signals supplied by the first circuit on the three outputs thereof is phase shifted with respect to each one of the other two alternating signals supplied by the first circuit on the three outputs thereof by an angle of 80° to 160° advance or delay.

each one of the alternating signals supplied by the first circuit on its three outputs is phase shifted with respect to each one of the two other alternating signals supplied by the first circuit on the three outputs thereof by an angle of 120° advance or delay.

the output of each one of the summing circuits is connected to a respective power detector.

The invention also provides a demodulator using direct frequency conversion comprising:

a vector addition device according to the invention;

a same number n of analog/digital converters each connected to a respective power detector; and a digital processing circuit determining the Cartesian components of the complex envelope of the signal applied to the second input of the vector addition device on the basis of measurements supplied by the n power detectors.

The invention further provides an RF receiver, comprising:
a demodulator according to the invention;
a local oscillator connected to the first input of the vector addition device;
an RF receiving antenna; and
an amplifier for the signal received by the antenna of the vector addition device.

The invention further provides a direct frequency conversion modulator-demodulator comprising a demodulator according to the invention, the modulator comprising:

a same number n of variable gain amplifiers, the input of each amplifier being connected to a respective output of the first circuit of the vector addition device;

a summing circuit receiving at the input thereof the output of each one of the n variable gain amplifiers;

a digital processing circuit supplying a same number n of amplifier gain commands based on Cartesian components of a complex envelope to be provided by modulation; and a same number n of digital/analog converters, the input of each one thereof being connected to the digital processing circuit and the output of each one being connected to the gain control input of a respective amplifier.

The modulator-demodulator can advantageously comprise a circuit allowing the second input of the vector addition circuit to be selectively connected to the output of the summing circuit receiving at its input the output of each one of the n variable gain amplifiers.

The invention further provides a transceiver comprising:
a modulator-demodulator according to the invention,
a local oscillator connected to the first input of the vector addition device; and
at least one RF antenna and at least one amplifier supplying the second input of the vector addition device and for delivering the signal obtained at the output of the summing circuit connected to the n variable gain amplifiers.

The invention further provides a method for calibrating the modulator of a modulator-demodulator according to the invention at a given frequency, the demodulator having been first calibrated at the given frequency, the method comprising the steps of:

applying an alternating signal at said given frequency to the first input of the vector addition device;

linking the second input of the vector addition circuit of the summing circuit receiving at the input thereof to the output from each one of the n variable gain amplifiers;

generating, by means of said modulator modulated signals based on signal complex envelope Cartesian components;

comparing complex envelope Cartesian components supplied by said demodulator as a result of the previous step with the complex envelope signal Cartesian components that were used for generating the modulated signals; and calibrating said modulator as a function of the results of the preceding steps.

Finally, the invention provides a method for calibrating the demodulator of a modulator-demodulator according to the invention at a given frequency, the modulator having been previously calibrated at said given frequency, the method comprising the steps of:

applying an alternating signal at said given frequency to the first input of the vector addition device;

linking the second input of the vector addition circuit to the output of the summing circuit receiving at the input thereof the output from each one of the n variable gain amplifiers;

generating, using said modulator, modulated signals on the basis of complex envelope signal Cartesian components;

comparing complex envelope Cartesian components supplied by said demodulator as a result of the preceding step with signal complex envelope Cartesian components that were used to generate modulated signals; and calibrating the demodulator as a function of the results of the preceding steps.

Further characteristics and advantages of the invention will become more clear from reading the description which follows of one preferred embodiment of the invention, provided by way of example and with reference to the attached drawings.

The device for vector addition of two alternating electric signals according to the invention comprises a first input for receiving a first alternating electric signal and a second input for receiving a second alternating electric signal. It comprises a first circuit connected to the first input and comprising n outputs, the first circuit supplying, from the first alternating signal applied to the first input, a respective alternating signal on each one of the n outputs, the alternating signals supplied on the n outputs being all of the same amplitude and same frequency, but mutually phase-shifted. These alternating signals supplied on the n outputs are phase shifted so that each one is neither in-phase nor in phase opposition with any other one thereof. In other words, in the Fresnel plane, none of the corresponding vectors is co-linear with another one of these vectors. n is greater than or equal to 3.

The device further comprises a second circuit connected to the second input and comprising the same number, n, of outputs, the second circuit splitting the second alternating signal to its n outputs. Finally, it comprises the same number n of summing circuits each receiving at their input a respective output from the first circuit and the respective output of the second circuit.

This device notably makes it possible to provide several signals resulting from the sum of a same alternating signal with another alternating signal of the same frequency, phase shifted on each occasion by another angle, thereby making it possible to then compare the two signals on the basis of the resulting signals.

Figure 1:
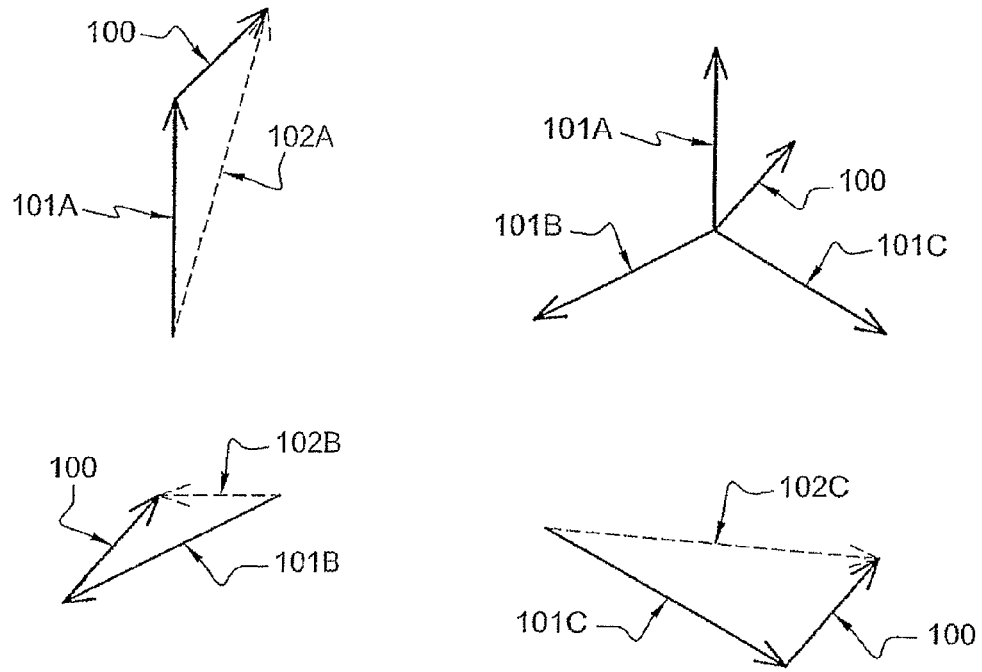
FIG. 1 is an illustration in the Fresnel plane of the electrical signals present in a vector addition device according to the invention.

In the Fresnel plane, the first signal supplies a sort of vectorial base defined by n vectors, each of which is then added to the second signal. FIG. 1 illustrates this situation with n equal to 3, Reference numeral 100 indicating the vector corresponding to the second signal which is added several times to the first signal, on each occasion phase-shifted, here by 120°, the vectors of which are indicated by 101A, 101B and 101C. The vectors resulting from the sums are identified by reference numerals 102A, 102B and 102C.

Such an addition device advantageously makes it possible to compare two alternating signals of the same frequency both from the point of view of their phase as well as their amplitude. For this, it is sufficient to have applied one to the first input of the device and the other to the second input of the device. In particular, comparison can be performed on the basis of the resultant vector modules which can be measured by a respective power detector. The fact that the signals from the n outputs of the first circuit are neither mutually in phase nor mutually in phase opposition makes it possible to ensure that each "projection" of the Fresnel vector corresponding to the first signal on the Fresnel vectors of the thus phase-shifted first signal is on each occasion different and that notably, one of these "projections" carries a significant proportion of the real and imaginary components of the vector corresponding to the second signal. This is advantageous when compared to the case where the signal is split into four signals which are on each occasion phase shifted by 90° as is the case in EP-A-0, 841,756 since, when signal phase is close to that of one of the four corresponding vectors, estimation of one of the components is poor and, consequently, uncertainty is higher.

It is preferable that the alternating signals supplied on the n outputs from the first circuit be each phase shifted with respect to all the others of the signals by an angle comprised in the range from 20°-160°, inclusive of the bounds, regardless of whether this is in advance or delayed. In other words, in the Fresnel plane, the direction of the vector corresponding to any one of these signals makes an angle of at least 20° with respect to the direction of the corresponding vector at any one whatsoever of these other signals. This makes it possible to achieve sufficient sensitivity to perform comparison. From this point of view, it is advantageous to choose, where n is equal to 3, a configuration for which each output signal from the first circuit is phase shifted by +120° and −120° with respect to the two other output signals.

This device advantageously finds application when an incoming signal is being compared to a reflective signal in order to determine a reflection factor, for example in electrical network analysis. Similarly, it finds application for determining transmission factor from an incoming signal and the transmitted signal for implementing a discriminator for radar.

This device also makes it possible to implement a demodulator by direct frequency conversion and by applying the modulated signal to the second input and the signal from a local oscillator set to the frequency of the modulated signal to the first input. Preferably, digital modulation is employed but analog modulation is also possible; preferably, use is made of phase and/or amplitude modulation, but frequency modulation is also possible. The fact of employing a summing circuit followed by quadratic detectors is advantageous compared to the use of mixers as is the case in U.S. Pat. No. 5,095,536, considering that the latter are more complex and expensive.

The fact of making n at least equal to three makes it possible to provide redundancy of information allowing correction of errors in the system. Firstly, the third vector makes it possible to eliminate ambiguity due to quadratic detection by frequency measurement. Then, such redundancy proves useful when it comes to reducing the impact of circuit imperfections which appear in the form of phase and gain mismatch, causing distortion on the demodulated signal constellation.

The case where n is equal to 3 is advantageous in view of its simplicity of implementation and limited cost when compared to the case where this number is greater than 3 as is the case in EP-A-0, 841,756. Ideally, the three signals supplied at the output by the first circuit are phase shifted by 120° in order to maximise the "projections" of the second signal on the various vectors of this vectorial base. The more we move away from this ideal, the more accuracy of comparison deteriorates in practice, but comparison remains possible even in the case where phase shifting is not more than the order of 20°.

Figure 2:
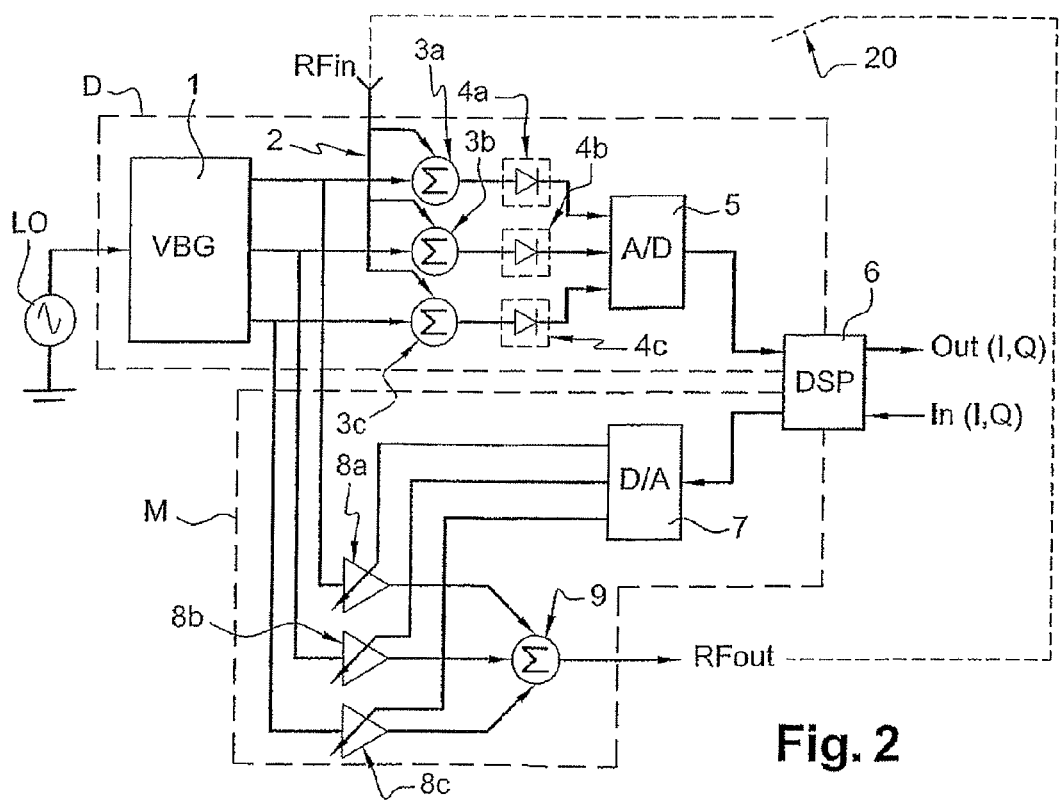
FIG. 2 is a block diagram of a transceiver implementing the invention.

We shall now describe a transceiver implementing the invention, a three channel (in other words with n equal to 3) vector addition device with reference to FIG. 2.

The receiver portion of the transceiver comprises a demodulator D, a local oscillator LO and a receiving antenna for the modulated signal RFin. Demodulator D comprises a vector base generator 1, an RF signal splitter 2, three RF signal summing circuits 3a, 3b and 3c, three power detectors 4a, 4b, 4c, an analog/digital conversion block 5 and a digital processing circuit 6.

As will become apparent from the description below, the vector base generator 1, the RF signal splitter circuit 2 and the three RF signal summing circuits 3a, 3b and 3c constitute a vector addition device as described above.

Demodulator D receives at its input the modulated RFin signal and the alternating signals from a local oscillator LO acting as a reference.

The signal from local oscillator LO is applied to the input of vector base generator 1. From this signal, vector base generator 1 provides at its output three alternating signals of the same frequency and same amplitude, but which are mutually phase shifted, each one of the three signals being supplied on a separate channel. Each one of these three channels is connected to an input of a respective summing circuit 3a, 3b and 3c. The phase shift between these three signals can be obtained using passive or active filters, transmission lines or any other circuit providing phase shifting of a signal in the range of frequency of operation of the demodulator.

Modulated signal RFin is amplified by a low noise amplifier, not shown, prior to being fed to splitter circuit 2. Splitter circuit 2 divides the modulated RFin signal into channels without introducing phase shift between them, and without introducing any difference of amplitude. Each of these three channels is connected to the input of a respective summing circuit 3a, 3b and 3c. Splitter circuit 2 is shown symbolically on FIG. 1 by an input branch to which three branches are connected, each branch being connected to an input of a respective summing circuit 3a, 3b and 3c. In practice, splitter circuit 2 can be implemented by transistors in parallel along with their matching and biasing circuits, which has the advantage of allowing integration of the circuit and providing a wide operating band compared to conventional structures based on propagation lines such as Wilkinson splitters.

Each summing circuit 3a, 3b and 3c consequently provides at its output a signal that corresponds to adding the signal supplied on a respective channel from a vector base generator 1 and signal RFin after splitting. The power of the output signal from each summing circuit 3a, 3b and 3c is measured by a respective power detector 4a, 4b and 4c providing at their output an analog signal representing signal power. Preferably, each power detector 4a, 4b and 4c is implemented using a non-linear circuit element such as a Schottky diode, followed by a low-pass filter for eliminating components other than baseband components from the signal.

The analog signal supplied by each power detector 4a, 4b and 4c is then converted into a digital signal by analog/digital converter block 5, the digital signal being supplied to digital processing circuit 6. Prior to conversion to digital, this analog signal can optionally be conditioned using a variable-gain amplifier and/or voltage or DC offset compensating circuit. Analog/digital converter block 5 is implemented using a respective analog/digital converter for each power detector 4a, 4b and 4c, these converters being sampled simultaneously to insure the three measurement channels are coherent.

In operation, the frequency of local oscillator LO is aligned with that of modulated signal RFin.

Digital processing circuit 6 determines the Cartesian components of a complex envelope—identified by reference OUT (I, Q) in FIG. 1—of modulated signal RFin by digital processing of the signals representative of the powers and measured by power detectors 4a, 4b and 4c. In other terms, digital processing circuit 6 supplies the demodulated signal. The digital processing circuit can conventionally include a microprocessor.

Digital processing can be based on a suitable algorithm and/or on a lookup table such as for example the one described by F. R. de Sousa, B. Huyart, S. Y. C. Catunda and R. N. de Lima in "A to D Converters and Look-up Table Dimensioning for Five-Port Reflectometer Based Systems>> published in the Proceedings of the IEEE conference *Instrumentation and measurement*, 2003, p. 743-747 incorporated by reference herein.

This digital processing is based on the transfer functions of the various demodulator channels, notably phase shifts and attenuations introduced by vector base generator 1, splitters circuit 2 and summing circuits 3a, 3b and 3c as well as by linearity defects of power detectors 4a, 4b and 4c. Additionally, these transfer functions generally vary depending on the frequency at which the demodulator is operating.

Transfer function parameters can be determined by a calibration process similar to that used in the prior art for 5-port or similar receivers. Typically, sequences of predetermined modulated signals are delivered by a base station to the transceiver which previously has stored in memory the Cartesian components I and Q—respectively the real and imaginary parts—corresponding to the complex envelope of the said signals. Following demodulation, digital processing circuit 6 calculates the calibration constants so that the Cartesian components obtained by demodulation are identical to those in memory, and thereby allowing demodulator D to be calculated as a function of the deviations observed.

To finish with the receiver portion, digital processing circuit 6 can additionally proceed with decoding the demodulated signal before restituting it in conventional fashion.

Below we shall describe a mathematical model of the operation of demodulator D. Vector base generator 1 supplies three signals each of which can be expressed by:

$$v_{LOi}(t) = \sqrt{a_i} \cdot V_{LO} \cdot \cos(\omega t + \beta_i) \quad (1)$$

in which
$V_{LO}$ and $\omega$ are respectively the amplitude and pulsation of the signal supplied by local oscillator LO;
$\gamma_i$ is relative phase on output channel i from vector base generator 1; and
$\sqrt{a_i}$ is the gain of output channel i considered of vector base generator 1.

Splitter circuit 2 supplies three signals each expressed by:

$$v_{RFi}(t) = \sqrt{b_i} \cdot V_{RF}(t) \cdot \cos(\omega t + \theta(t) + \lambda_i) \quad (2)$$

in which:
$V_{RF}(t)$, $\theta(t)$ and $\omega$ are respectively instantaneous amplitude, instantaneous phase and the pulsation of modulated signal RFin received at the input;
$\lambda_i$ is relative phase of output channel i considered from splitter 2.

$\sqrt{b_i}$ is the gain of output channel i considered from splitter 2.

Where the power detectors 4a, 4b and 4c operate as quadratic detectors, each will supply a signal at its output represented by the following equation:

$$v_i(t) = a_i \cdot V_{LO}^2 + b_i \cdot V_{RF}(t)^2 + c_i \cdot V_{RF}(t) \cdot \cos(\theta(t) - \phi_i) \quad (3)$$

in which $\phi_i = \gamma_i - \lambda_i - \lambda_i$, $c_i$ is dependent on $a_i$ and $b_i$, $V_{LO}$ which is supposed constant, $a_i$, $b_i$, $\gamma_i$ et $\lambda_i$ are the parameters mentioned above in equations 1 and 2.

The baseband components, in other words real part $I(t) = V_{RF}(t) \cdot \cos \theta(t)$ and imaginary part $Q(t) = V_{RF}(t) \cdot \cos \theta(t)$, are determined by a linear combination of signals $v_i(t)$ supplied by the power detectors 4a, 4b and 4c weighted by the calibration constants, as shown by the equations below:

$$I(t) = \sum_{i=1}^{n} \alpha_i v_i(t) + \kappa_I \quad (4)$$

$$Q(t) = \sum_{i=1}^{n} \beta_i v_i(t) + \kappa_Q \quad (5)$$

in which n is a number of outputs from the vector adding circuit and $\alpha_i$, $\beta_i$, $\kappa_I$ and $\kappa_Q$ are constants dependent on the values of. $a_i$, $b_i$, $\gamma_i$, $\lambda_i$ and $V_{LO}$.

The calibration process mentioned previously consequently consists in determining $\alpha_i$, $\beta_i$, $\kappa_I$ and $\kappa_Q$. In our case, for n=3, these constants are expressed as a function of the parameters $\alpha_i$, $\beta_i$, $\kappa_I$ and $\kappa_Q$ from matrix inversion of the three equations system linking the three measurement data $v_3'(t)$, $v_4'(t)$ and $v_5'(t)$ with the three unknowns $V_{RF}(t)^2$, $I(t)$, $Q(t)$ below:

$$v_3'(t) = b_3 \cdot V_{RF}(t)^2 + c_3 \cdot \cos \phi_3 I(t) + c_3 \cdot \sin \phi_3 Q(t)$$

$$v_4'(t) = b_4 \cdot V_{RF}(t)^2 + c_4 \cdot \cos \phi_4 I(t) + c_4 \cdot \sin \phi_4 Q(t)$$

$$v_5'(t) = b_5 \cdot V_{RF}(t)^2 + c_5 \cdot \cos \phi_5 I(t) + c_5 \cdot \sin \phi_5 Q(t)$$

with $v_3'(t) = v_3(t) - a_3 \cdot V_{LO}^2$, $v_4'(t) = v_4(t) - a_4 \cdot V_{LO}^2$, $v_5'(t) = v_5(t) - a_5 \cdot V_{LO}^2$.

The variables $v_3(t)$, $v_4(t)$, $v_5(t)$ are analog output voltages of the power detectors. The constants $a_i \cdot V_{LO}^2$ can be determined prior by performing measurements at the outputs of the power detectors with $v_{RFi}(t) = 0$ and $v_{LO}(t) = V_{LO} \cdot \cos \omega t$. Experimental methods making it possible to resolve the equations system above are well known in the literature, such as for example the one described by the article of F. R. de Sousa, B. Huyart, and R. N. de Lima entitled "A new method for automatic calibration of 5-port reflectometers" in *Journal of Microwave and Optoelectronics*, vol. 3, N. 5, pp. 135-144, July 2004 which is incorporated herein by reference and in which the constants are estimated starting from RF signals slightly offset in frequency, with voltage measurements at the outputs of the quadratic detectors.

The transmitter portion of the transceiver is based on a modulator M. Modulator M comprises a digital processing circuit which can be common with demodulator D as shown in the diagram in FIG. 1 by circuit 6. It also includes a digital/analog conversion blocks 7 and three variable gain RF amplifiers 8a, 8b and 8c and an RF signal summing circuit 9.

Although not included in block M in FIG. 1, modulator M further comprises the vector base generator 1 which is consequently advantageously common with demodulator D. Each of the three output channels from VBG 1 is applied to the input of a respective amplifier 8a, 8b and 8c.

The gain of each amplifier is controlled by a respective signal determined by digital processing circuit 6 from the Cartesian components In(I, Q) of the coded signal to be modulated for transmission. This digital processing is based on the transfer functions of each channel of the modulator, notably the phase shifts and attenuations introduced by vector base generator 1 and linearity defects of the amplifiers 8a, 8b and 8c. Here again, transfer functions generally vary depending on the frequency at which the modulator is operating.

It will be understood, that the amplifiers 8a, 8b and 8c do not necessarily operate at a gain higher than unity, but can also operate, or exclusively operate, at a gain less than unity, in other words operate as an attenuator. The gain control signals determined by digital processing circuit 6 are converted to analog signals by digital/analog conversion block 7 to each be applied to the control input of a respective amplifier 8a, 8b and 8c. Digital/analog conversion block 7 is implemented by a respective digital/analog converter for each amplifier 8a, 8b and 8c.

The output from each amplifier 8a, 8b and 8c is fed to a respective input of summing circuit 9. Consequently, summing circuit 9 provides at its output the modulated signal RFout which is the sum of the three signals supplied by the amplifiers 8a, 8b and 8c.

To finish with the description of the transmitter, output signal RFout from modulator M is then conventionally amplified and fed to a broadcast antenna. Further, coding of the signal to be transmitted can be performed by digital processing circuit 6 prior to determining the gain control signals of the amplifiers 8a, 8b and 8c.

Both the vector adding device according to the invention as well as the demodulator and the modulator-demodulator which incorporate it can be implemented so as to work at any frequency whatsoever at which the receiver and transceiver operate. They are particularly suitable for operation at frequencies above or equal to 900 MHz and can also be employed in wideband or multi-band applications covering several Gigahertz.

The receiver and transceiver of the invention can operate in differing frequency bands by tuning the local oscillator frequency to the desired frequency. In the case of the transceiver, transmission and reception can occur at the same frequency or at different frequencies by suitably changing local oscillator frequency.

The invention provides an economic transceiver solution suitable for TDD (time division duplex) operation given that the vector base generator is common to the transmitting portion and receiving portion. It is possible to implement a transceiver using FDD (frequency division duplex) operation by adding a second vector base generator, specific to the demodulator and the other to the modulator.

Further, the transceiver can be the object of automatic calibration of its modulator M once demodulator D has been calibrated. Initial calibration of demodulator D can be done conventionally, notably as described above. A controlled switch 20—typically implemented by a transistor—makes it possible to selectively connect the output RFout from modulator M to the input RFin of demodulator D. This connection is shown in dashed lines on FIG. 2. Digital processing circuit 6 has in memory the Cartesian components of the complex envelope of a predetermined sequence of signals. In order to proceed with calibration of a modulator M, digital processing circuit 6 causes switch 20 to close. Then, it proceeds with the modulation using these Cartesian components in memory, while determining the gain controls for amplifiers 8a, 8b and 8c based on the parameters of modulator M it has in memory. The modulated signals supplied at the output by modulator M are then demodulated by demodulator D. Digital processing circuit 6 then compares the Cartesian components of the complex envelope obtained from demodulation with the corresponding Cartesian components in memory that were used for modulation. Digital processing circuit 6 then proceeds with calibration of modulator M as a function of deviations found during comparison. This calibration is made possible by the fact that demodulator D has been previously calibrated so that the deviations found from comparison only originate from the error on the parameters of modulator M in memory in digital processing circuit 6.

Likewise, the transceiver can then be the object of automatic calibration of its demodulator D after its modulator M has been calibrated in conventional fashion.

These automatic calibration procedures can also be implemented even in the case where modulator (M) and the demodulator (D) each have their own vector base generator. They can also be applied in prior art modulators-demodulators.

Figure 3:
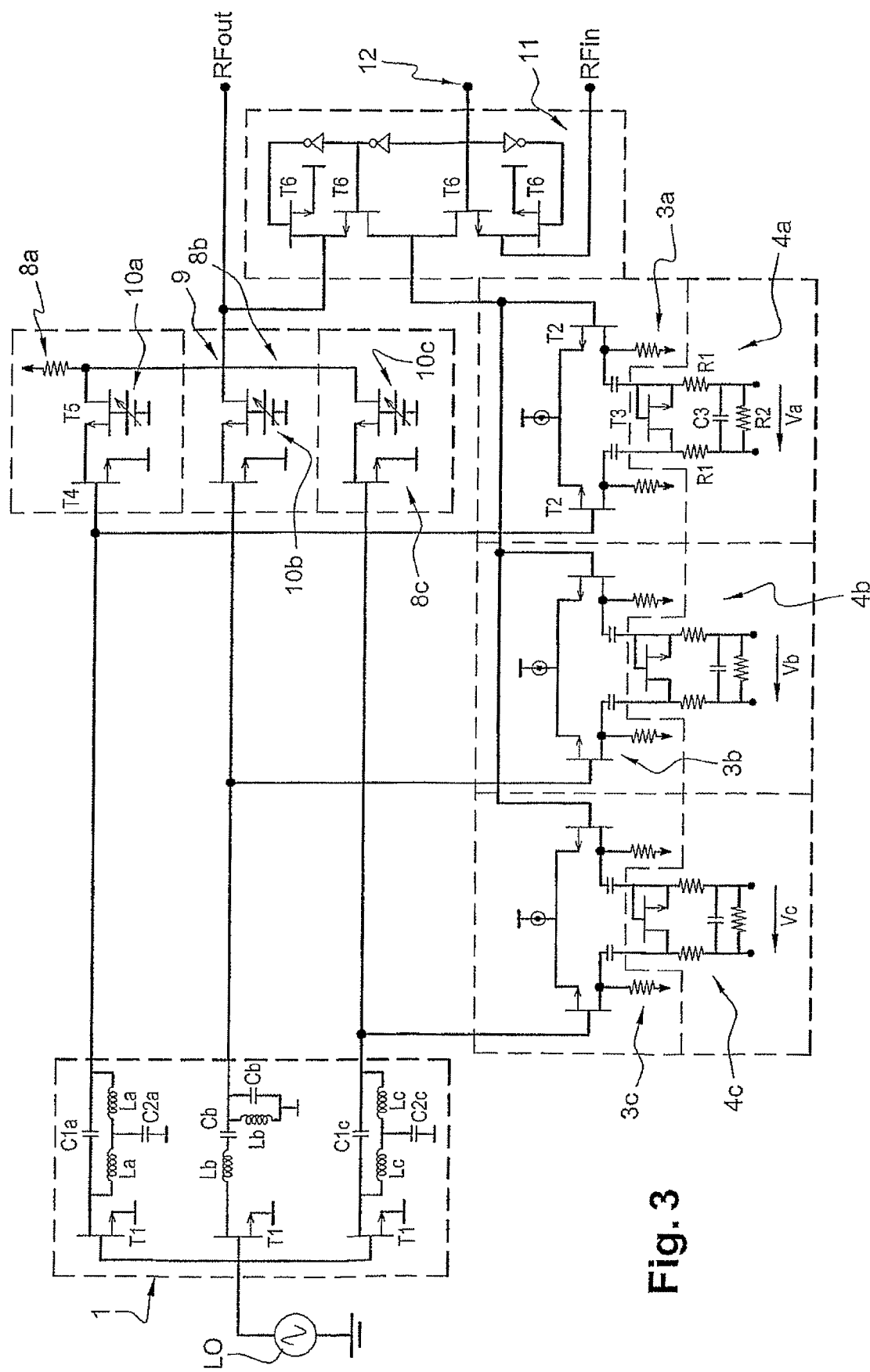
FIG. 3 is a circuit diagram of one particular embodiment of a transceiver according to the invention.

FIG. 3 is a simplified circuit diagram of the transceiver of FIG. 2 implemented in MMIC (microwave multimodule integrated circuit) technology, using GaAs technology (ED02AH) of the OMMIC company. In particular, the matching and biasing circuits have not been shown for the sake of simplicity.

Vector base generator 1 has a one-to-three channel splitter circuit made up by three amplifiers the input of each being connected to local oscillator LO. In our case, each amplifier is implemented in the form of a transistor T1 of the FET 20 μm×4 type. The fact of having recourse to a splitter circuit based on amplifiers makes it possible to maintain constant response over a very wide frequency band.

Transistors T1 are followed by a respective phase shifting circuit which supply the three mutually phase-shifted outputs. In the case here, use is made of two all-pass filters and a fourth-order passband filter. The following are values for components that supply 120° phase-shift between two consecutive output channels of vector base generator 1 in the frequency band 1.8 to 5.5 GHz:

| | | |
|---|---|---|
| C1a: 0.16 pF | Cb: 0.47 pF | C1c: 0.31 pF |
| C2a: 0.65 pF | Lb: 4.2 nH | C2c: 1.25 pF |
| La: 2.9 nH | Lc: 5.6 nH | |

The summing circuits 3a, 3 b and 3c as well as power detectors 4a, 4b and 4c are implemented in identical fashion. For this reason, only the components of summing circuit 3a and power detector 4a are indicated in FIG. 3.

Summing circuits 3a, 3b and 3c are each implemented using a pair of transistors T2 in a differential amplifier configuration. In the example shown, the transistors T2 are of the FET 20 μm×2 type. Using transistors provides the advantage of operation over a wide frequency band when compared to summing circuits using transmission lines. Furthermore, they offer a choice of amplification which can be an advantage when it is envisaged to use the circuit with low power RF signals. The power detectors 4a, 4b and 4c are each constituted by a transistor T3, in the example illustrated of the FET 10 μm×1 type, with the channel close to pinch-off causing it to operate in a highly non-linear mode close to that of a Schottky diode. They are each followed by a low-pass filter in order to only keep the second order terms resulting from addition of the signals by summing circuits 3a, 3b and 3c. In the case illustrated, each lowpass filter comprises resistors R1 and R2 and capacitor C 3, the values of which are:

| R1: 0.5 kΩ | R2: 10 kΩ | C3: 10 pF |
|---|---|---|

The lowpass filter of each power detector 4a, 4b and 4c outputs a respective output voltage Va, Vb and Vc which are then digitized by analog/digital conversion block 5—not shown in FIG. 3—for the purposes of digital processing in order to supply the Cartesian components of the complex envelope of modulated signal RFin.

It should be pointed out that in the circuit of FIG. 3, modulated signal RFin is applied to the gates of three summing transistors circuits 3a, 3b and 3c. The connection to their gates is possible as isolation between drain and gate is extremely high which makes it possible to consider the transistor as being unidirectional. The matching circuit—not shown—takes account of the reflection factor of the three transistors to allow matching. Individually, each transistor operates as an amplifier. In this way, the splitter circuit identified by reference numeral 2 in FIG. 2 is obtained.

The variable gain amplifiers 8a, 8b and 8c of modulator M are all implemented in the same way, for which reason only one of the amplifier components 8a is indicated in FIG. 3. Each amplifier comprises two transistors T4 and T5 in a cascode configuration. The gain control voltages are shown symbolically by a respective generators 10a, 10b and 10c. In the example shown, transistors T4 are of the FET 25 μm×4 type and transistors T5 are of the FET 22.5×2 type. The fact of employing the amplifiers 8a, 8b and 8c in a cascode circuit is advantageous as it suffices to connect their outputs together to provide adder 9, in view of their high insulation.

Finally, the transceiver comprises a switching block 11 making it possible to selectively connect together the RFout output from the modulator and the RFin input of the demodulator as a function of a control signal applied to the input 12. This makes it possible to implement the automatic calibration procedure of the modulator or demodulator as described above with reference to FIG. 2. Block 11 is based on four transistors T6, in the case illustrated of the FET 65 μm×8 type.

Figure 4:
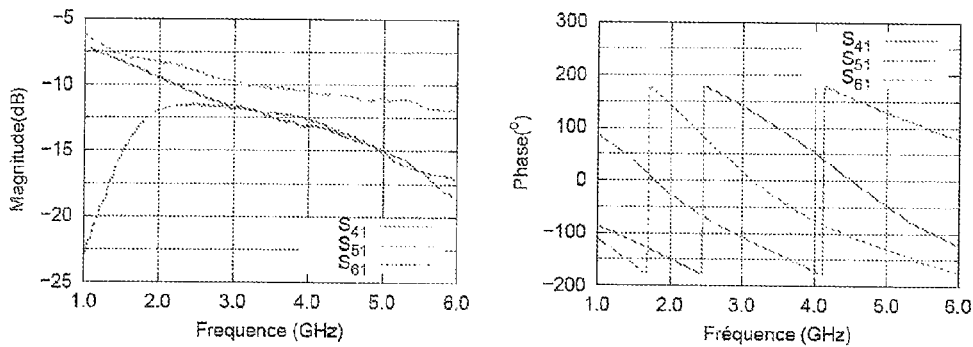
FIGS. 4 to 6 illustrate the results obtained with the circuit described in relation with FIG. 3.
Figure 5:
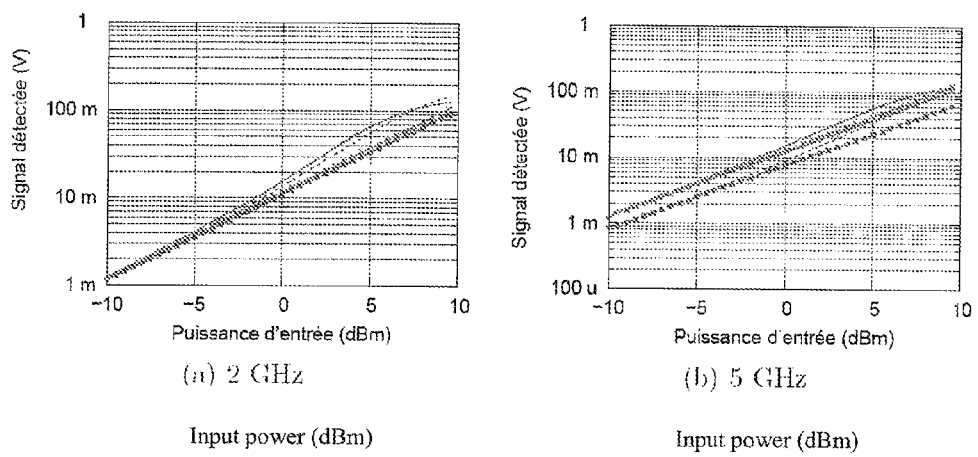
Figure 6:
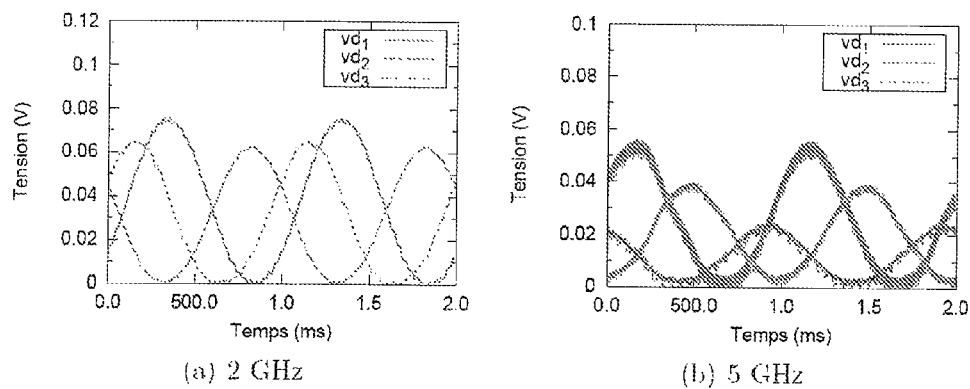

FIGS. 4-6 illustrate the results obtained using the circuit described with reference to FIG. 3.

More particularly, FIG. 4 shows the transmission coefficients of the three channels of vector base generator 1. The modulus of the coefficients is located at between −7 dB and −17 dB in the band comprised between 1.8 GHz and 5.5 GHz. Regarding phase shifting, we obtained 120° relative between the three channels at around 3.5 GHz, and at the limits phase deviations are around 80° and 160°.

Voltages measured at the outputs from the detectors before and after the linearization procedure are illustrated on FIG. 5. As the detectors cannot be characterised in isolated fashion, we applied a power ramp varying from −10 dBm to +10 dBm at the input of the demodulator circuit for two separate frequencies, specifically 2 GHz and 5 GHz.

We applied a 0 dBm signal to the input of vector base generator 1 and another signal at −3 dBm to the input of the demodulator. We carried out measurements at 2 GHz and 5 GHz after setting a 1 kHz shift between the two generators. The measured voltages are illustrated in FIG. 6.

These results show that the circuit is capable of supplying baseband voltages which do correspond to signal power resulting from adding to RF signals combined on different phase shifts, thereby allowing calculation of the complex ratio between these two signals and consequently performing the demodulation function. Further, it has been shown that the amplitude of the three phase-shifted RF signals is varied depending on a control voltage, thereby allowing the modulation function to be performed.

Obviously this invention is not limited to the examples and embodiment described and illustrated, but may be the subject of numerous variations available to those skilled in the art.

The invention claimed is:

1. A device comprising:
a first circuit configured to split a first electrical signal into a first set of n electrical signals, wherein each of the n electrical signals in the first set is phase shifted relative to other electrical signals in the first set, wherein the first circuit comprises n amplifiers;
a second circuit configured to split a received modulated electrical signal into a second set of n electrical signals; and
n summing circuits, wherein each of the n summing circuits is configured to sum one electrical signal from the first set of n electrical signals with one electrical signal from the second set of n electrical signals to generate n output signals for use in demodulating the received modulated electrical signal.

2. The device of claim 1, wherein each of the n electrical signals in the first set is phase shifted between 20° and 160° relative to the other electrical signals in the first set.

3. The device of claim 1, wherein each of the n summing circuits comprises two transistors in a differential amplifier configuration.

4. The device of claim 1, wherein n is 3.

5. The device of claim 4, wherein each of the n electrical signals in the first set is phase shifted 120° relative to the other electrical signals in the first set.

6. The device of claim 1, wherein each of the n electrical signals in the first set is phase shifted between 80° and 160° relative to the other electrical signals in the first set.

7. The device of claim 1, wherein each of the n summing circuits is connected to a respective power detector.

8. The device of claim 7, wherein the respective power detector comprises a transistor and a low-pass filter.

9. The device of claim 1, further comprising:
n analog to digital converters, wherein each of the n analog to digital converters is connected to n power detectors; and
a digital processing circuit configured to determine Cartesian components of a complex envelope of the received modulated electrical signal.

10. The device of claim 9, wherein the Cartesian components are determined based on measurements by the n power detectors.

11. The device of claim 1, further comprising:
a local oscillator connected to the first circuit, wherein the local oscillator is configured to provide the first electrical signal; and
an antenna configured to receive the modulated electrical signal.

12. The device of claim 11, further comprising an amplifier configured to amplify the modulated electrical signal.

13. A method comprising:
splitting, with a first circuit, a first electrical signal into a first set of n electrical signals, wherein each of the n electrical signals in the first set is phase shifted relative to other electrical signals in the first set, wherein the first circuit comprises n amplifiers;
splitting, with a second circuit, a received modulated electrical signal into a second set of n electrical signals; and
summing one electrical signal from the first set of n electrical signals with one electrical signal from the second set of n electrical signals to generate n output signals for use in demodulating the received modulated electrical signal.

14. The method of claim 13, wherein n is 3.

15. The method of claim 13, wherein each of the n electrical signals in the first set is phase shifted between 80° and 160° relative to the other electrical signals in the first set.

16. The method of claim 13, further comprising converting the n output signals into digital signals.

17. The method of claim 13, further comprising:
measuring a power of the n output signals; and
determining Cartesian components of a complex envelope of the received modulated signal based on the power of the n output signals.

18. A device comprising:
means for splitting a first electrical signal into a first set of n electrical signals, wherein each of the n electrical signals in the first set is phase shifted relative to other electrical signals in the first set;
means for splitting a received modulated electrical signal into a second set of n electrical signals;
means for summing one electrical signal from the first set of n electrical signals with one electrical signal from the second set of n electrical signals to generate n output signals for use in demodulating the received modulated electrical signal; and
means for determining Cartesian components of a complex envelope of the received modulated electrical signal.

19. The device of claim 18, further comprising means for measuring power of the n output signals.

20. The device of claim 18, further comprising means for converting the n output signals into digital signals.

* * * * *